(12) United States Patent
Cannon et al.

(10) Patent No.: US 7,102,370 B2
(45) Date of Patent: Sep. 5, 2006

(54) COMPLIANT MICRO-BROWSER FOR A HAND HELD PROBE

(75) Inventors: James E. Cannon, Colorado Springs, CO (US); David J. Dascher, Monument, CO (US); Michael T. McTigue, Colorado Springs, CO (US); Stuart O. Hall, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 30 days.

(21) Appl. No.: 10/829,725

(22) Filed: Apr. 22, 2004

(65) Prior Publication Data

US 2005/0237078 A1    Oct. 27, 2005

(51) Int. Cl.
*G01R 31/02* (2006.01)
(52) U.S. Cl. ................................ 324/754; 324/761
(58) Field of Classification Search ..................... None
See application file for complete search history.

(56) References Cited

U.S. PATENT DOCUMENTS

| | | | | |
|---|---|---|---|---|
| 3,676,776 A | * | 7/1972 | Bauer et al. | 324/72.5 |
| 4,245,189 A | * | 1/1981 | Wahl et al. | 324/716 |
| 4,721,903 A | * | 1/1988 | Harsch et al. | 324/72.5 |
| 6,037,787 A | * | 3/2000 | Corwith | 324/754 |
| 6,400,167 B1 | * | 6/2002 | Gessford et al. | 324/754 |

OTHER PUBLICATIONS

Inventor Rebecca N. Cullion, "Method And Apparatus For Differential Test Probe Retention With Complaint X-Axis Positioning", filed with USPTO Jul. 30, 2002: U.S. Appl. No. 10/208,641, Agilent Technologies, Inc. case No. 10020522-1, 13 pgs specification, claims, & abstract, 5 pages Formal Drawings Fig. 1-5.

\* cited by examiner

*Primary Examiner*—Vinh Nguyen
*Assistant Examiner*—Russell M. Kobert

(57) ABSTRACT

A micro-browser has pair of rods each rod entering a corresponding bore in a sleeve that retains them, and that may itself be carried by a grip shaped to be rotated between a thumb and a finger. The edge of a small circuit board is soldered at the distal end of the rod. One of the rods is allowed to rotate within its bore in the sleeve, while the other is held stationary by a notch in the sleeve. The rotatable rod has a captive spring that resists the force of probe contact. Each board carries a coupling network connected to a short sharp probe tip bent downward away from the plane of its board, allowing the distance between the probe tips to be a function of the amount of rotation. The other end of each coupling network is coupled to a short length of a respective 50 Ω coaxial cable that passes through an axial slot in the grip to enter an amplifier pod that drives a main cable leading to test equipment. The rods may be held within the bores by friction created by slight bends in the rods. The circuit boards each include shields connected together at a location that is as close as possible to the probe tips by arranging that the rods touch each other near the probe tips. If the rods are parallel, then there is a slight bend in the non-rotating rod at the location where it passes the non-probe-carrying edge of the circuit board, such that it touches the corresponding portion of the rotatable rod. If the rods are both straight, then the axes of the rods are coplanar but convergent.

20 Claims, 7 Drawing Sheets

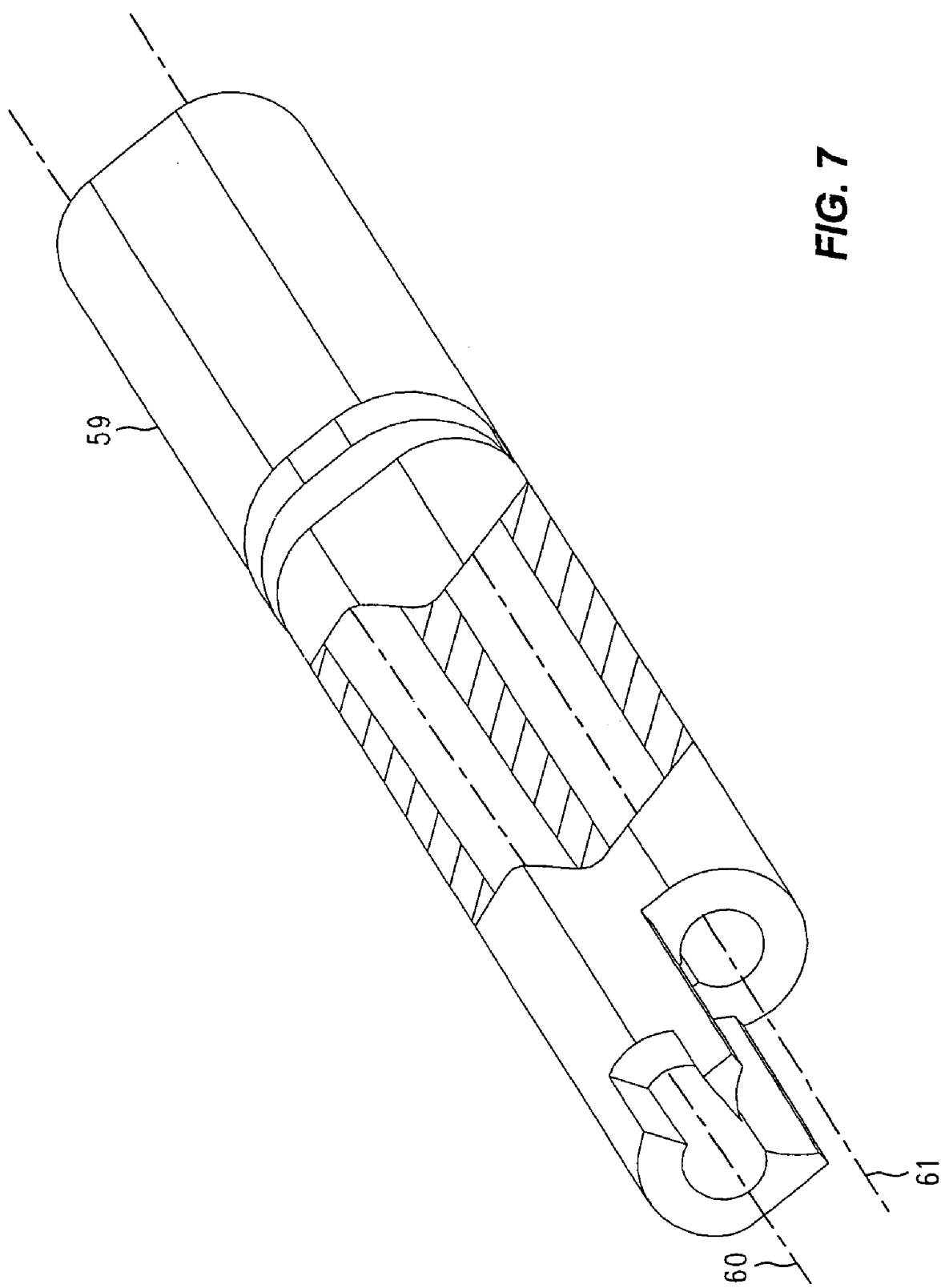

COMPLIANT MICRO-BROWSER FOR A HAND HELD PROBE

BACKGROUND OF THE INVENTION

Many types of electronic test equipment (e.g., oscilloscopes) often involve the probing of a circuit of interest with a hand held probe. The probe might acquire a single-ended signal or a differential one, and there may or may not be a ground connection using a "flying lead" (a short length of flexible insulated wire with an alligator clip or other fastener at the free end). In the old days when components were large and frequency response was limited, the ground was generally a flying lead originating at the probe and was connected someplace convenient, while the tip of the probe was either pressed against or hooked onto a lead of a component in the circuit whose behavior was being measured. While those circumstances still sometimes occur, today's high density packaging of fast or high frequency circuitry often precludes it, and users of test equipment have complained to the designers of that test equipment that the techniques for probing need improvement.

In particular, it is often necessary to probe the signals at two places on a PCB (Printed Circuit Board) that: (1) Are some arbitrary distance apart; (2) Are traces leading to surface mounted components with no leads around which a probe tip may be hooked, requiring that sharp probe tips be pressed into those traces; and (3) Carry signal that have high frequency components (say, in the Giga Hertz region).

To accomplish these tasks a number of desirable properties of such a probe have been identified, and various designs have been offered. These desirable properties include adjustable spacing between a pair of small sharp probe tips with spring loading. They are small to cooperate with high frequency operation. They are sharp to allow them to penetrate any protective coatings and stay in place by slightly gouging into the trace. At least one is spring loaded to help them stay in place and not slip, even though the operator's hand may move or wiggle slightly during the measurement.

The "smallness" mentioned in the preceding paragraph is actually a manifestation of several factors. First, size matters in high frequency circuitry; dimensions that exceed a significant fraction of a wavelength, even for a simple conductive path, are apt to add unwanted reactance that interferes with frequency response. Component densities nowadays are high, compared to the past, with more components crowded into smaller space. Those familiar with modem probes will appreciate that high frequency probes have been getting smaller, and that the reduction in size, necessary as it is, complicates their use. The reason for this is that it is difficult to provide small yet robust mechanical structures that incorporate adjustability and compliance while also observing good high frequency practices. Mechanical arrangements that require two hands to set probe spacing are a liability, as there often simply isn't room to hold the probe in place with one hand while moving an adjustment lever with a finger of the other hand. We need a small adjustable and complaint high frequency probe that can be easily used and adjusted with just one hand. In fact, given the foreseeable bandwidth (10 to 12 GHz), we need it to be just as small as we can manage. Such a small probe is (excuse the pun) quite a large order. What to do?

SUMMARY OF THE INVENTION

A micro-browser for probing high frequency signals has pair of parallel rods that are spaced close together. Each rod enters a corresponding bore in a sleeve that then retains and carries the rods, and that itself is carried by a grip that is shaped to be held between a thumb and a finger, and also rotated therebetween. At the distal end of each rod the edge of a small circuit board is soldered to that rod such that the board's edge is parallel to the axis of the rod. One of the rods is allowed to rotate within its bore in the sleeve, while the other is not, and is held stationary by a notch in the sleeve that engages an end of the board. As viewed along the axes of the rods, the two circuit boards can lie in the same plane, form one of two right angle bends, or form other lesser bends, all by rotating the rotatable rod through a range of at least 180°. Each circuit board carries a parallel RC network in series with a damping resistor whose other end is connected to a short sharp probe tip. The parallel RC network, damping resistor and (a projection of the) probe tip are essentially along an axis parallel to, but displaced from, the axis of the rod to which the circuit board is soldered. The probe tips are each bent downward away from the plane of its associated circuit board. This combination of rotation and downward bends allow the distance between the probe tips to be a function of the amount of rotation applied to the rod/circuit board combination that is free to rotate. The rotatable rod/circuit board has a captive spring that communicates a force along the axis of the rotatable rod, and in a direction toward the trace, for applying that probe tip to the trace and without interfering with rotation. The other end of each RC combination is coupled to a short length of a respective 50 Ω coaxial cable that leaves the circuit board, passes through a respective axial slot in the grip to enter an amplifier pod that drives a main cable having sufficient length to reach the test equipment.

In operation, the spring loaded rotatable probe tip is pressed against an intended location. This is done by rotating the grip (and thus the entire micro-browser) before any contact is made. Once contact is made with the rotatable probe tip, (and assuming there is not yet contact by the stationary probe tip) further rotation of the grip also rotates the sleeve, which in turn causes an eccentric rotation of the stationary probe tip that varies the spacing between the two probe tips. (Maximum spacing occurs somewhere when the two probe tips are "inside" an obtuse angle [or "outside" the corresponding acute angle] formed by the circuit boards, and minimum spacing occurs when the two probe tips are "inside" an acute angle formed by the circuit boards.) By moving the grip in a circular path (orbiting) without rotation the general orientation of the stationary probe tip relative to the other can be controlled—think up, down, left and right here, and not so much about distance, although distance will be affected. When both the correct spacing and the correct general orientation are achieved by a combination of orbiting and rotation, the stationary probe tip will then be positioned above the other location to be probed. An angular displacement of the axis of the grip within the plane containing that axis (a "tilting" of the entire micro-browser without further rotation or orbiting) will lower the stationary probe tip onto the target location. The resilience of the movable probe tip's spring will enable that probe tip to continue making contact as the stationary probe tip is firmly pressed into its location with sufficient force to make reliable electrical contact. Once contact is made with both probe tips a reasonable amount of tilting and "rocking" (motion in a direction orthogonal to tilting) can be tolerated without either probe tip losing electrical contact, provided the single spring remains compressed in response to force from the operator. Without any spring the tilting would have to exact, and rocking could only be tolerated at the acceptable amount of tilt. A second spring does not seem necessary.

The rods may be held in place within the sleeve by friction against the bores created by slight hump-shaped bends in those portions of the rods that enter the bores. This is not only simple, but promotes easy replacement of those rods/circuit board/probe tips, simply by unplugging their cable from the amplifier pod, easing the cable out of the slot in the grip, and then pulling the rod out of the bore.

The small circuit boards each include a shield over their RC network. The shields are electrically connected to the braid of the associated transmission line, and also to the associated rod carrying the circuit board. It is good RF practice that the two shields be electrically connected together at a location that is as close as possible to the probe tips, and not just back at the other (amplifier pod) end of the transmission lines. This desirable connection is obtained by a slight bend in the non-rotating rod at the location where it meets the non-probe-carrying edge of the small circuit board, such that the rod touches the corresponding portion of the (straight) rotatable rod. Now, no matter how the micro-browser assembly orbits or rotates, the two rods continue to touch, and the two shield grounds are made common at the desired physical location.

In one alternate embodiment both rods are straight, and the axes of the bores in the sleeve are coplanar but convergent, so that the tips of the rods touch. In another alternative embodiment the functions of the sleeve and grip are combined into one assembly.

BRIEF DESCRIPTION OF THE DRAWINGS

FIG. 7 is a cross sectional view of a sleeve for use with the alternate embodiment of FIG. 6, and that provides the coplanar but convergent axes for the rods.

DESCRIPTION OF A PREFERRED EMBODIMENT

Figure 1:
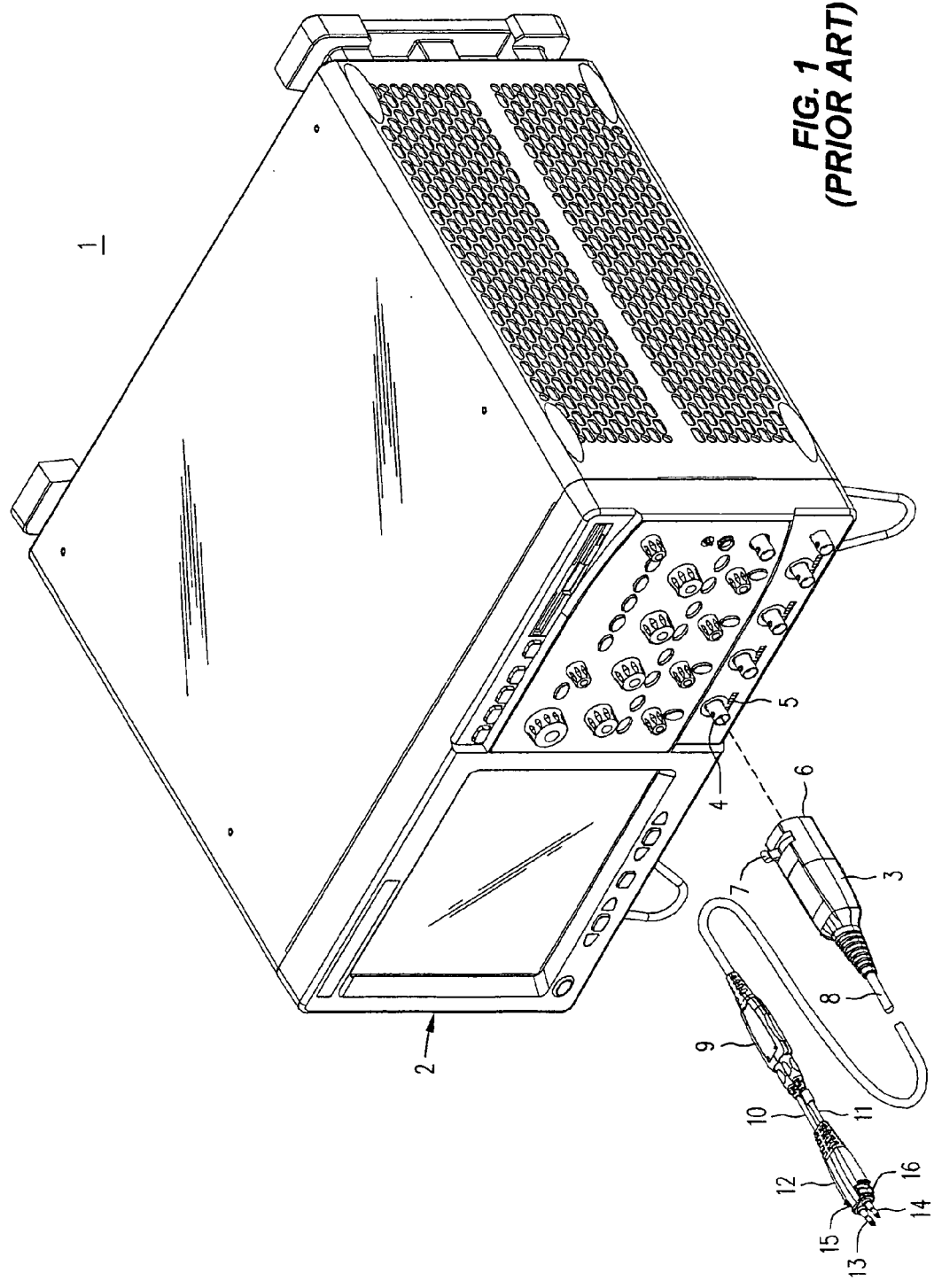
FIG. 1 is a perspective view of a prior art hand held browser (probe) for a digital oscilloscope.

Refer now to FIG. 1, wherein is shown a front perspective view 1 of an electronic instrument 2, such as a digital oscilloscope, having one or more front panel connectors 4 that receive a push-lock BNC connector 3, say, in support of operation with active probes. In a manner known in the prior art, the push-lock BNC probe housing is installed simply by lining it up and then pushing it toward the 'scope. When the push-lock connector 3 is in place, not only is a BNC connection established to connector 4, but a row of spring loaded pins 6 (not visible) on the front of the housing for the push-lock assembly engages a row 5 of contacts beneath the connector 4. To remove the push-lock connector the operator pushes on lever or tab 7 with a thumb or a finger, while pulling the assembly away from the 'scope. A main cable 8 carries both power and signal information to an amplifier pod 9, which may contain high frequency amplifiers.

A pair of coaxial transmission lines (10, 11) couple a prior art browser 12 to the amplifier pod 9. Emerging from the front of the browser 12 are a pair of probe tips 13 and 14 that are each: (1) Rotatable about it axis as it extends out of the browser 12; and (2) Slightly bent after leaving the housing of the amplifier pod. The slight bends allow the distance between the tips of the probes 13 and 14 to vary as a function of their rotation. To this end, the rotation of each probe tip is independently controllable by an associated lever 15 and 16, respectively. Each probe tip is also spring loaded against force applied along the direction of the axis of rotation.

Figure 2:
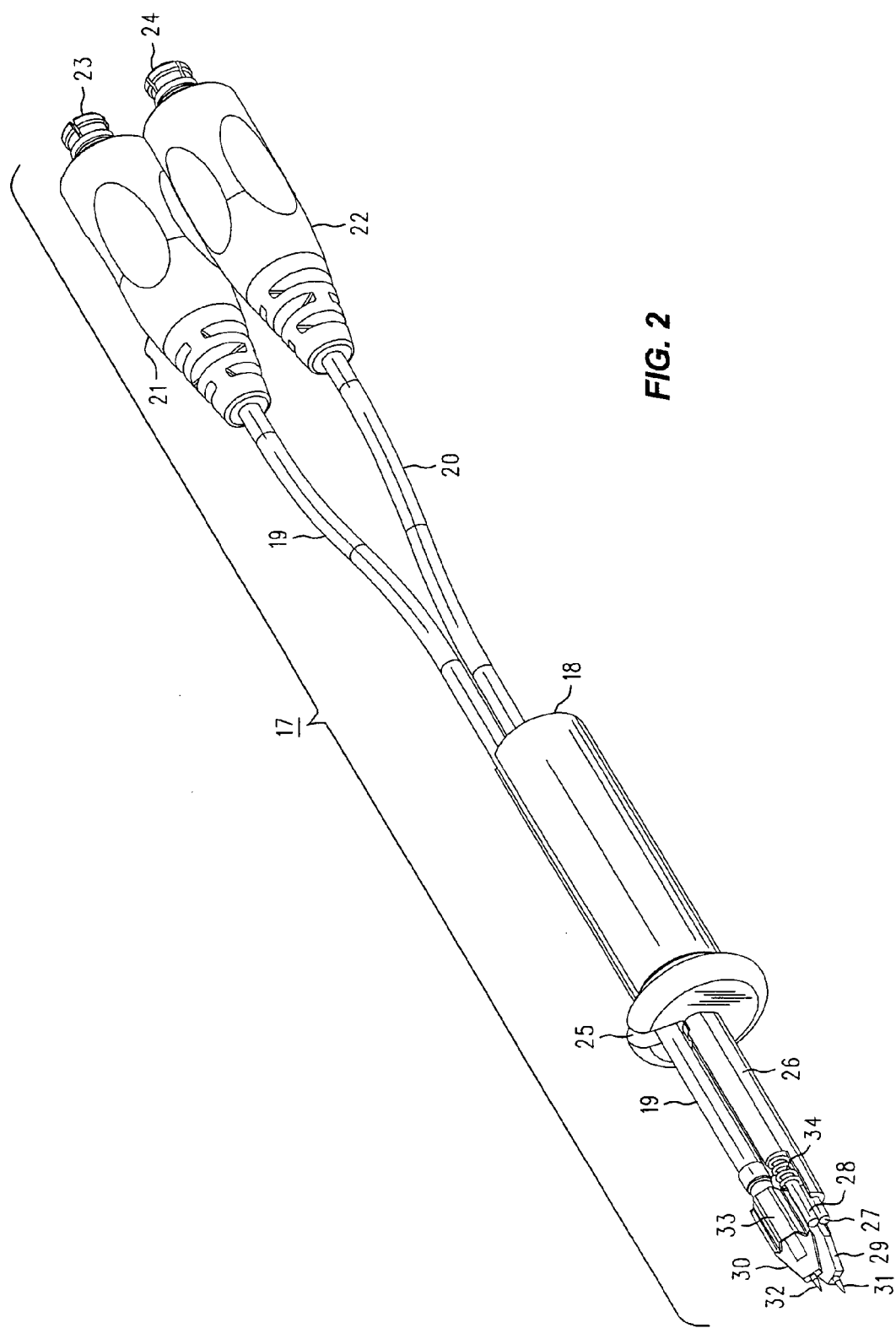
FIG. 2 is a perspective view of a micro-browser constructed in accordance with the principles of the invention.

Refer now to FIG. 2, wherein is shown a perspective view of a micro-browser 17 constructed in accordance with the principles of the invention. The view shows a grip 18 which has received a sleeve 26. Although better shown in FIG. 3, the sleeve 26 has two parallel bores that carry rods 27 and 28 that are preferably metallic and conductive, say, of brass bearing a suitable plating. The ends of those rods are each soldered to the side of a respective small circuit board, 29 and 30. Each small circuit board carries a coupling network whose physical appearance is better shown in FIGS. 4 and 5, and which is shielded by a conductive cover (or shield) of which only one (33) thereof is visible in FIG. 2. Each of the small circuit boards has a small sharp probe tip (31, 32). The probe tips are electrically connected to an associated coupling network, which is coupled to a associated coaxial cable (19, 20) that may also function as a transmission line. A slot 25 carries cable 19, while a second slot 49 (visible in FIG. 3) carries the other cable 20.

Rod 28 and its circuit board 30 are free to rotate at least 180° about the axis of the rod. A spring 34 fits over rod 28 and provides resilient resistance to compression between circuit board 30 and the sleeve 26 in a direction along the axis of rod 28. Rod 27 and its circuit board 29 are prevented from rotating by a notch 35 in the end of the sleeve that engages the end of the small circuit board 29 (see FIG. 3).

The two cables 19 and 20 have respective strain relieving boots 21 and 22 that also carry suitable coaxial connectors 23 and 24 that plug into corresponding connectors in the amplifier pod 9. It will be understood, then that the micro-browser 17 is a replacement item for the prior art browser 12 (& 13–16) of FIG. 1.

In operation, the spring loaded rotatable probe tip 32 is pressed against an intended location. This is done by rotating the grip 18 (and thus the entire micro-browser 17) before any contact is made. Once contact is made with the rotatable probe tip 32, (and assuming there is not yet contact by the other, stationary, probe tip 31) further rotation of the grip 18 also rotates the sleeve 26, which in turn causes an eccentric rotation of the stationary probe tip that varies the spacing between the two probe tips 31 and 32. (Maximum spacing occurs somewhere when the two probe tips are "inside" an obtuse angle [or "outside" the corresponding acute angle] formed by the circuit boards 29 and 30, and minimum spacing occurs when the two probe tips are "inside" an acute angle formed by the circuit boards. The fact that the two probe tips 31 and 32 do not lie along extensions of the axes of the rods 28 and 27 makes this change in spacing possible.) By moving the grip 18 in a circular path (orbiting) without rotation the general orientation of the stationary probe tip 31 relative to the other (32) can be controlled—think up, down, left and right here, and not so much about distance, although distance will be affected. When both the correct spacing and the correct general orientation are achieved by a combination of orbiting and rotation, the stationary probe tip 31 will then be positioned above the other location to be probed. An angular displacement of the axis of the grip 18 within the plane containing that axis (a "tilting" of the entire micro-browser without further rotation or orbiting) will lower the stationary probe tip onto the target location. The resilience of the movable probe tip's spring 34 will enable that probe tip 32 to continue making contact as the stationary probe tip is firmly pressed into its location with sufficient force to make reliable electrical contact. Once contact is made with both probe tips a reasonable amount of tilting and "rocking" (motion in a direction orthogonal to tilting) can be tolerated without either probe tip coming off, provided the single spring remains compressed in response to force from the operator. Without any spring the tilting would have to exact, and rocking could only be tolerated at the acceptable amount of tilt.

Figure 3:
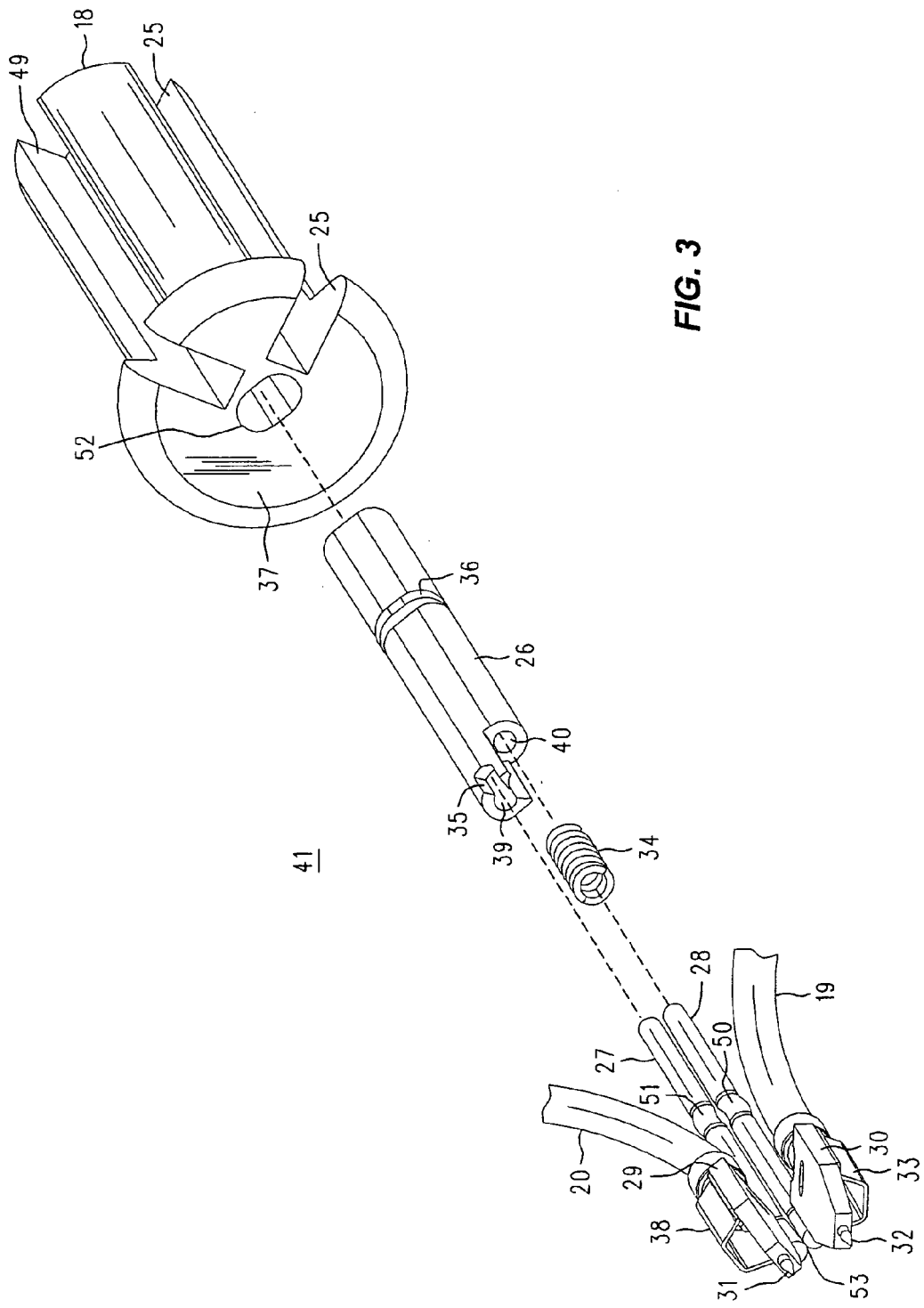
FIG. 3 is an exploded perspective view of probe tip, circuit board, rod, sleeve and grip portions of the micro-browser of FIG. 2.

Referring now to FIG. 3, we see an exploded perspective view 41 of most of the stuff in FIG. 2. The parts have been rotated about 90° clockwise in FIG. 3, so that slot 49 for cable 20 is visible. Due to the exploded nature of the drawing, the bores 39 and 40 in the sleeve 26 are visible. Bore 39 receives rod 27 while bore 40 receives rod 28. Note bends 50 and 51 in the rods 28 and 27, respectively. These slight hump-shaped bends cause the friction that retains the rods in their bores.

Also visible in the figure is oval shaped bore 52 in the grip 18. It receives the sleeve 26 until stop 36 limits the penetration of the sleeve 26 into the bore 52. Bore 52 may have a slight taper to provide a minor amount of interference with sleeve 26, and thus retain it in the bore by friction. Note that the oval shape of the bore 52 cooperates with a corresponding oval exterior of the sleeve to positively communicate any rotation of the grip to the sleeve.

A notch 35 is visible in FIG. 3 adjacent the aperture of the bore 39. What this does is engage the back side of the small circuit board 29, and cause it to be stationary, or non-rotating about the axis of its bore within the sleeve.

Also visible in FIG. 3 is that the distal ends of the two rods 27 and 28 touch at location 53, despite the majority of the rods being parallel elsewhere along the length of their axes. This touching is also electrical contact, and is accomplished by a slight bend in the stationary rod 27 (see also location 47 in FIG. 5). Thus, no matter the rotation of rotatable rod 28, the two rods continue to touch. This is of significance to the shields 33 and 38, each of which are soldered to a ground supplied by its associated coaxial cable (19 and 20). The idea is to get those two grounds tied together as close as possible to the probe tips.

Figure 4:
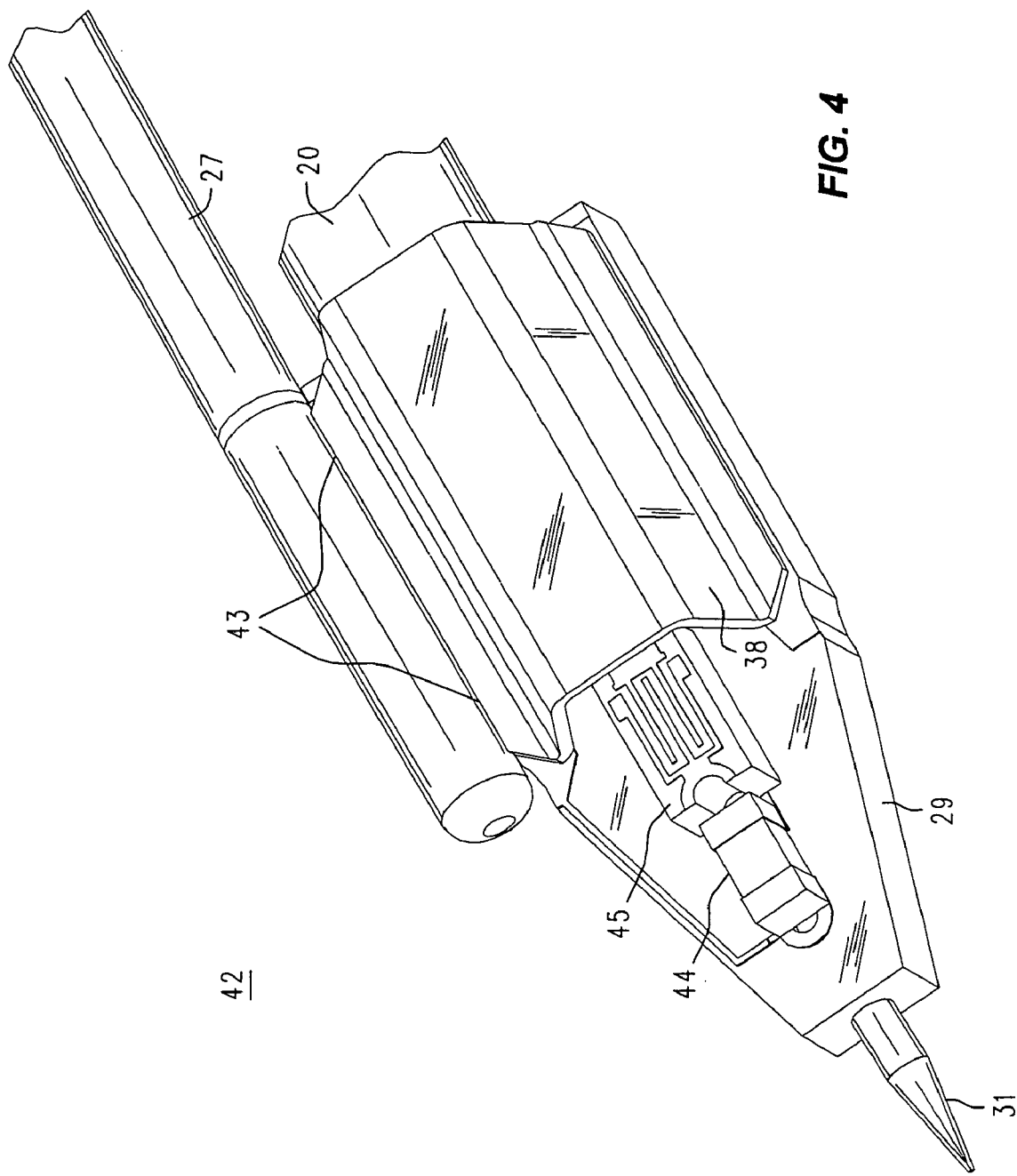
FIG. 4 is a more detailed perspective view of one of the circuit boards and rods of FIG. 3.

Referring now to FIG. 4, shown therein is a perspective view 42 of the rod 27 with its small circuit board 29. Board 29 and shield 38 are soldered to rod 27 along edge 43. Also shown are various of the passive components that comprise a coupling network for the micro-browser. In particular, item 44 is a damping resistor, while item 45 is an RC network that may be laser trimmed after assembly. The shield 38 does not completely cover item 45 to allow just such trimming. The circuit board is small, only about 0.110" wide and about 0.400" inches long, with a height of 0.077", including the shield.

Figure 5:
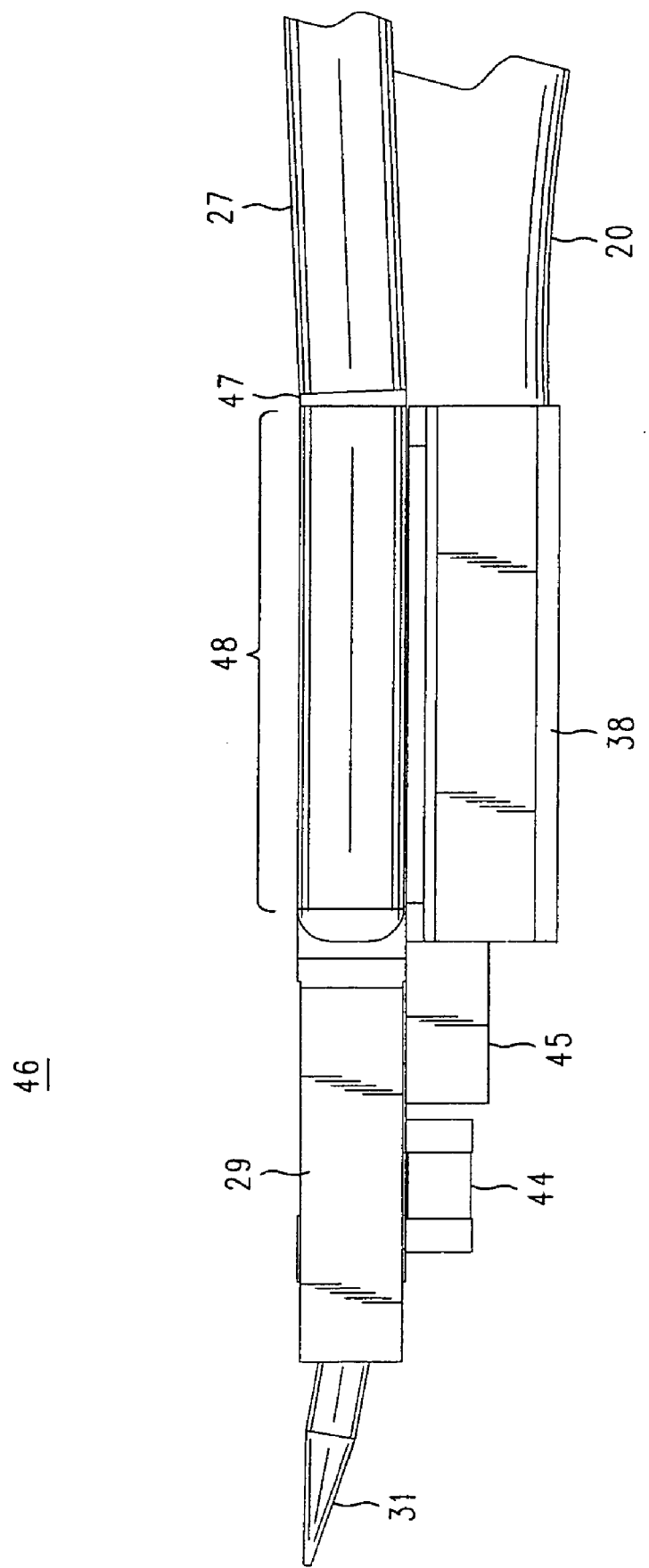
FIG. 5 is a side view of the circuit board and rod of FIG. 4.

FIG. 5 is a side view of what is shown in FIG. 4, and allows a better view of the location 47 of the bend in rod 27 that allows rod-to-rod contact at location 53 (see FIG. 3), and of the manner in which the tip 31 is disposed at an angle to the plane of the circuit board 29.

Figure 6:
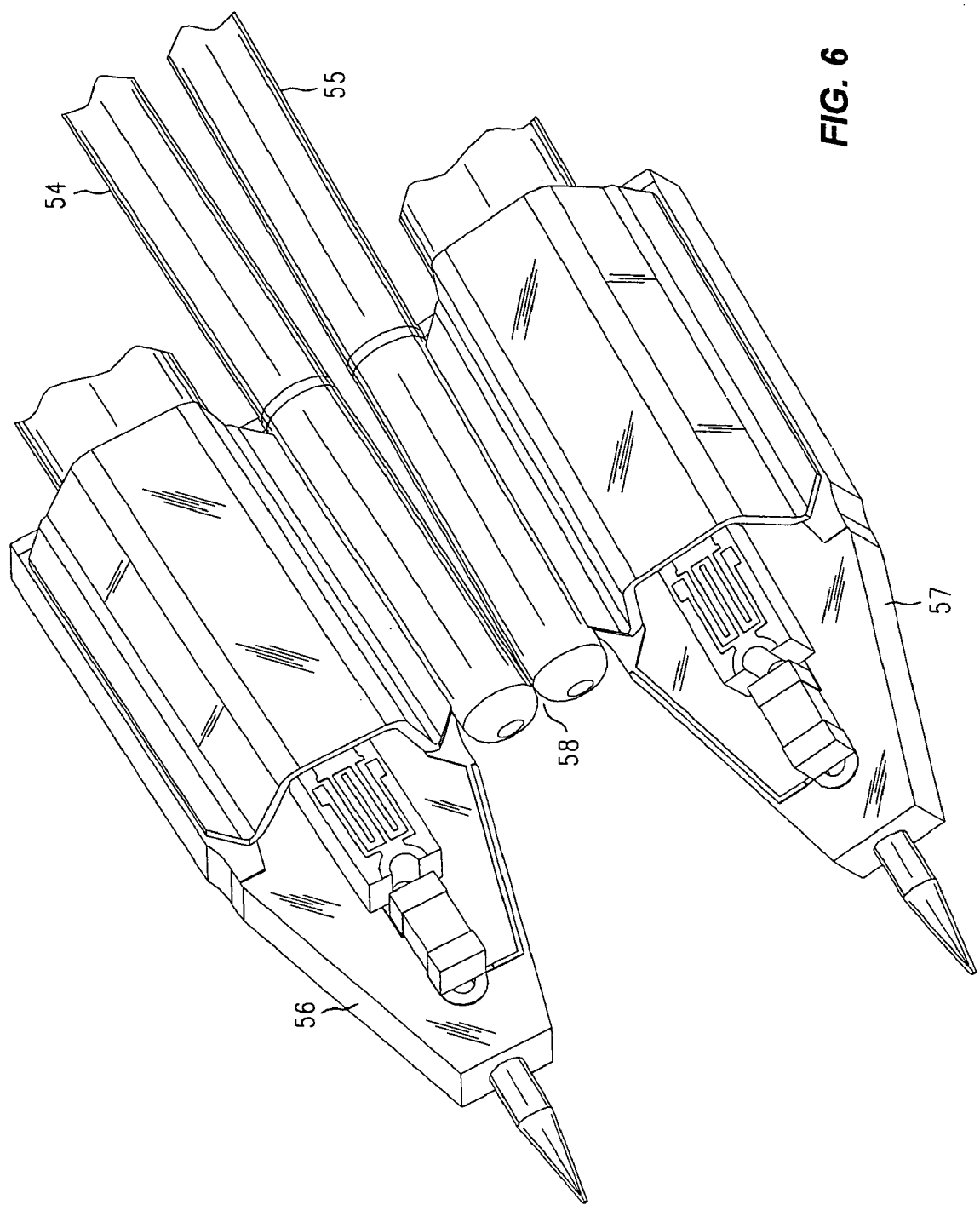
FIG. 6 is a perspective view of the circuit boards and rods for an alternate embodiment wherein the rods are both straight, their axes are coplanar but convergent at the ends of the rods near the probe tips.

FIGS. 6 and 7 describe an alternate embodiment where both of the rods 54 and 55 are straight, have axes that are coplanar, but convergent such that the ends (58) of the rods near the circuit boards 56 and 57 are touching. This is condition is obtained by having the axes of the bores 60 and 61 in the sleeve 59 be coplanar, but convergent along the direction toward the probe tips.

We claim:

1. A hand held probe for electronic signals, comprising:
   first and second rods;
   a sleeve having first and second bores each sized to receive a respective one of the first and second rods, the axes of the bores being parallel;
   first and second contact assemblies, each attached to a first distal end of the respective rod and each having a probe tip that is displaced from the axis of the rod to which that contact assembly is attached;
   a second distal end of each of the first and second rods being carried within the respective bore in the sleeve;
   the first contact assembly being non-rotatable about the axis of the first rod;
   the second contact assembly being rotatable about the axis of the second rod and eccentrically rotatable about the axis of the first rod to vary the spacing between the probe tips of the first and second contact assemblies when the sleeve is manipulated with the probe tip of the second contact assembly in physical contact with a second location to be probed and as the probe tip of the first contact assembly is positioned proximate a first location to be probed;
   a spring coupled between the sleeve and the combination of the second rod and second contact assembly to resist force pushing the second rod into the second bore; and
   first and second conductors each respectively coupled at a distal end thereof to a corresponding one of the contact assemblies and coupleable at their other ends to electronic test equipment.

2. A hand held probe as in claim 1 further comprising a grip having a bore along an axis thereof and that receives the sleeve.

3. A hand held probe as in claim 1 wherein the contact assemblies are each circuit boards that are soldered along one edge thereof to their respective rod, and each probe tip is inclined at an angle to the plane of its associated circuit board.

4. A hand held probe as in claim 3 wherein each contact assembly further comprises a coupling network.

5. A hand held probe as in claim 4 wherein each coupling assembly further comprises a shield disposed over its associated coupling network.

6. A hand held probe as in claim 1 wherein the first and second rods are conductive and the first rod has, proximate where the non-rotatable first contact assembly is attached thereto, a bend in the direction of the second rod, and touches the second rod proximate where the rotatable second contact assembly is attached to the second rod.

7. A hand held probe as in claim 1 wherein the spring is a spiral compression spring disposed over the second rod and located between the second contact assembly and the sleeve.

8. A hand held probe as in claim 1 wherein the sleeve has adjacent the first bore a notch for receiving a portion of the first contact assembly and the first contact assembly becomes non-rotatable upon engaging the notch.

9. A hand held probe as in claim 1 wherein the first and second rods are retained by friction within their respective bores by friction caused by slight bends in the rods within those portions of those rods that enter the bores.

10. A hand held probe as in claim 1 wherein the first and second conductors are coaxial cables, and the grip further comprises at least one slot along the axis of the grip and that carries the coaxial cables.

11. A hand held probe for electronic signals, comprising:
first and second rods;
a sleeve having first and second bores each sized to receive a respective one of the first and second rods, the axes of the bores being coplanar and convergent;
first and second contact assemblies, each attached to a first distal end of the respective rod and each having a probe tip that is displaced from the axis of the rod to which that contact assembly is attached;
a second distal end of each of the first and second rods being carried within the respective bore in the sleeve;
the first distal ends of the first and second rods being in physical contact owing to the convergence of the axes of those rods;
the first contact assembly being non-rotatable about the axis of the first rod;
the second contact assembly being rotatable about the axis of the second rod and eccentrically rotatable about the axis of the first rod to vary the spacing between the probe tips of the first and second contact assemblies when the sleeve is manipulated with the probe tip of the second contact assembly in physical contact with a second location to be probed and as the probe tip of the first contact assembly is positioned proximate a first location to be probed;
a spring coupled between the sleeve and the combination of the second rod and second contact assembly to resist force pushing the second rod into the second bore; and
first and second conductors each respectively coupled at a distal end thereof to a corresponding one of the contact assemblies and coupleable at their other ends to electronic test equipment.

12. A hand held probe as in claim 11 further comprising a grip having a bore along an axis thereof and that receives the sleeve.

13. A hand held probe as in claim 11 wherein the contact assemblies are each circuit boards that are soldered along one edge thereof to their respective rod, and each probe tip is inclined at an angle to the plane of its associated circuit board.

14. A hand held probe as in claim 13 wherein each contact assembly further comprises a coupling network.

15. A hand held probe as in claim 14 wherein each coupling assembly further comprises a shield disposed over its associated coupling network.

16. A hand held probe as in claim 11 wherein the spring is a spiral compression spring disposed over the second rod and located between the second contact assembly and the sleeve.

17. A hand held probe as in claim 11 wherein the sleeve has adjacent the first bore a notch for receiving a portion of the first contact assembly and the first contact assembly becomes non-rotatable upon engaging the notch.

18. A hand held probe as in claim 11 wherein the first and second rods are retained by friction within their respective bores by friction caused by slight bends in the rods within those portions of those rods that enter the bores.

19. A hand held probe as in claim 11 wherein the first and second conductors are coaxial cables, and the grip further comprises at least one slot along the axis of the grip and that carries the coaxial cables.

20. A hand held probe as in claim 11 wherein the first and second rods are conductive.

* * * * *